United States Patent
Kim et al.

(10) Patent No.: US 11,430,514 B2
(45) Date of Patent: Aug. 30, 2022

(54) SETTING AN UPPER BOUND ON RRAM RESISTANCE

(71) Applicant: International Business Machines Corporation, Armonk, NY (US)

(72) Inventors: Youngseok Kim, Upper Saddle River, NJ (US); Soon-Cheon Seo, Glenmont, NY (US); Choonghyun Lee, Rensselaer, NY (US); Injo Ok, Loudonville, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/147,401

(22) Filed: Jan. 12, 2021

(65) Prior Publication Data
US 2022/0223205 A1    Jul. 14, 2022

(51) Int. Cl.
*G11C 13/00* (2006.01)
*H01L 45/00* (2006.01)

(52) U.S. Cl.
CPC ...... *G11C 13/0028* (2013.01); *G11C 13/0026* (2013.01); *H01L 45/1233* (2013.01); *H01L 45/146* (2013.01); *H01L 45/1691* (2013.01)

(58) Field of Classification Search
None
See application file for complete search history.

(56) References Cited

U.S. PATENT DOCUMENTS

| | | | |
|---|---|---|---|
| 9,530,493 B2 | 12/2016 | Eleftheriou et al. | |
| 10,497,752 B1 | 12/2019 | Ando et al. | |
| 2009/0283833 A1* | 11/2009 | Bach | H01L 27/11521 257/773 |

(Continued)

FOREIGN PATENT DOCUMENTS

| | | |
|---|---|---|
| CN | 102543168 | 7/2012 |
| WO | 2005/093839 | 10/2005 |
| WO | 2016/126375 | 8/2016 |

OTHER PUBLICATIONS

Bocquet et al., In-Memory and Error-Immune Differential RRAM Implementation of Binarized Deep Neural Networks, 2018 IEEE International Electron Devices Meeting (IEDM) Dec. 2018, Conference Paper. pp. 1-4.

(Continued)

*Primary Examiner* — James G Norman
(74) *Attorney, Agent, or Firm* — Samuel Waldbaum; Otterstedt & Kammer PLLC (57) ABSTRACT

An electronic circuit includes a plurality of word lines; a plurality of bit lines intersecting the plurality of word lines at a plurality of grid points; and a plurality of resistive random-access memory cells located at the plurality of grid points. Each of the resistive random-access memory cells includes a top metal coupled to one of: a corresponding one of the word lines and a corresponding one of the bit lines; a bottom metal coupled to another one of: the corresponding one of the word lines and the corresponding one of the bit lines; a dielectric sandwiched between the top metal and the (Continued)

bottom metal; and a high-resistance semiconductive spacer electrically connecting the top metal and the bottom metal in parallel with the dielectric.

16 Claims, 11 Drawing Sheets

(56) References Cited

U.S. PATENT DOCUMENTS

| | | | |
|---|---|---|---|
| 2016/0196874 A1* | 7/2016 | Eleftheriou | H01L 45/085 257/4 |
| 2018/0006088 A1 | 1/2018 | Sheng et al. | |
| 2018/0233665 A1 | 8/2018 | Chen | |
| 2019/0165266 A1 | 5/2019 | Trinh | |

OTHER PUBLICATIONS

Gokmen et al., Acceleration of Deep Neural Network Training with Resistive Cross-Point Devices, Front. Neurosci 10, 333 (Jul. 2016), arXiv:1603.07341v1 [cs.LG], pp. 1-13.

Gokmen et al., Training Deep Convolutional Neural Networks with Resistive Cross-Point Devices Front Neurosci 11, Oct. 2017. pp. 1-13.

Gu et al., "Scalability with silicon nitride encapsulation layer for Ti/HfOx pillar RRAM." Proc. 2010 International Symposium on VLSI Technology, System and Application. Apr. 2010. (pp. 146-147). IEEE.

Kinoshita et al., Universal understanding of direct current transport properties of ReRAM based on a parallel resistance model, Journal of Materials Research; Feb. 2008, 23(03):812-818.

Neelakantan et al., Adding Gradient Noise Improves Learning for Very Deep Networks, Machine Learning (stat. ML); Machine Learning (cs.LG), arXiv:1511.06807v1 [stat.ML] Nov. 2015. pp. 1-11.

Rossnagel et al., "Characteristics of ultra-thin Ta and TaN films," J. Vac Sci. & Techn. 20:2328, Nov. 2002. pp. 1-10.

Sriraman et al., HfO2 Based Resistive Switching Non-Volatile Memory (RRAM) and its Potential for Embedded Applications, 2012 International Conference on Solid-State and Integrated Circuit (ICSIC 2012), IPCSIT vol. 32 (Mar. 2012) IACSIT Press. pp. 1-5.

Theodoridis, "Investigation of Resistive Random Access Memory for 1T1R Nanowire Array Integration," Master's Thesis, Lund Univ. Fac. Sci., May 2020. pp. 1-52.

Authorized Officer Andreas Groger, European Patent Office as ISA, related PCT application PCT/EP2022/050126, ISR and Written Opinion, 15 pages total, dated May 20, 2022.

* cited by examiner

SETTING AN UPPER BOUND ON RRAM RESISTANCE

BACKGROUND

The present invention relates to the electrical, electronic, and computer arts, and more specifically, to resistive random-access memory.

Resistive random-access memory (ReRAM or RRAM) is a type of non-volatile random-access memory (RAM) that works by changing the resistance across a dielectric solid-state material, often referred to as a memristor. This technology bears some similarities to conductive-bridging RAM (CBRAM) and to phase-change memory (PCM). One type of RRAM is produced by generating filaments in a thin oxide layer. In successfully fabricated RRAM, the filaments can be moved by an electric field between a low-resistance state (LRS), where they form a highly conductive path through the oxide layer, and a high-resistance state (HRS), where they do not provide a conductive path through the oxide layer.

RRAM is useful, for example, in artificial intelligence applications (e.g., neural network training/inferencing)

SUMMARY

Principles of the invention provide techniques for setting an upper bound on RRAM resistance.

In one aspect, an exemplary electronic circuit includes a plurality of word lines; a plurality of bit lines intersecting the plurality of word lines at a plurality of grid points; and a plurality of resistive random-access memory cells located at the plurality of grid points. Each of the resistive random-access memory cells includes a top metal coupled to one of: a corresponding one of the word lines and a corresponding one of the bit lines; a bottom metal coupled to another one of: the corresponding one of the word lines and the corresponding one of the bit lines; a dielectric sandwiched between the top metal and the bottom metal; and a high-resistance semiconductive spacer electrically connecting the top metal and the bottom metal in parallel with the dielectric.

According to another aspect, an exemplary method is provided for making a resistive random-access memory. The method includes forming a bottom metal onto a base structure that includes a bottom contact, so that the bottom metal contacts the bottom contact. The method also includes forming a dielectric on top of and contacting the bottom metal; forming a top metal on top of and contacting the dielectric; and forming a hardmask on top of and contacting the top metal. Further, the method includes forming a high-resistance semiconductive spacer electrically contacting the top metal and the bottom metal. The method then includes depositing an interlayer dielectric over the hardmask and the high-resistance spacers; forming a via and trench in the interlayer dielectric; and forming a top contact that contacts the top metal, by filling the via and trench with metal.

According to still another aspect, an exemplary resistive random-access memory cell for interconnection with a word line and a bit line includes a top metal configured for connection with one of the word line and the bit line; a bottom metal configured for connection with another one of the word line and the bit line; a switchable dielectric that is sandwiched between the top metal and the bottom metal and electrically connects the top metal to the bottom metal, wherein the switchable dielectric is adapted to take on a high-resistance state in response to a first applied electric field and take on a low-resistance state in response to a second applied electric field; and a high-resistance semiconductive spacer electrically connecting the top metal and the bottom metal in parallel with the dielectric, wherein the high-resistance semiconductive spacer has a resistance at least equal to but not more than one hundred times a design value of resistance of the switchable dielectric in its high-resistance state.

In view of the foregoing, techniques of the present invention can provide substantial beneficial technical effects. For example, one or more embodiments provide one or more of:

Enhanced reliability of RRAM modules even in the presence of manufacturing defects.

Higher production yield of RRAM modules.

Improved stability of RRAM filament layer by encapsulation from air exposure.

These and other features and advantages of the present invention will become apparent from the following detailed description of illustrative embodiments thereof, which is to be read in connection with the accompanying drawings.

DETAILED DESCRIPTION

In the fabrication of an RRAM module, filaments are typically formed in a thin oxide layer. Proper operation of the module depends on proper formation of the filaments. However, some filaments are overformed, producing "shorts" (resistance too low) in which the RRAM module cannot achieve its high-resistance state (HRS). Other filaments are underformed, producing "opens" (resistance too high) in which the RRAM module cannot achieve its low-resistance state (LRS). Such shorts or opens can introduce errors in matrix multiplication operations reliant on RRAM, as in artificial intelligence applications (e.g., neural network training/inferencing).

A one-transistor-one-resistor ("1T1R") setup can be used to mitigate potential shorts. In the 1T1R setup, a transistor in series with the RRAM module must switch on before current can flow. The transistor is switched off by the same signal that should set the RRAM module to its HRS, so even if the RRAM module is shorted, the switched-off transistor simulates the expected HRS. In other words, the 1T1R approach provides a lower bound to the RRAM resistance in the high-resistance state.

One or more embodiments advantageously provide an upper bound to the RRAM resistance in any state. The upper bound is provided by forming a high-resistance structure (high-resistance spacers) in parallel to the module, integral with the module body. In one or more exemplary embodiments, metal-insulator transition materials (e.g., $TiO_xN_y$—titanium oxynitrides) can be used for the high-resistance structure. In one or more embodiments, $Ta_xN_y$ (tantalum nitride) or $Ti_xN_y$ (titanium nitride) films can be used.

Figure 1:
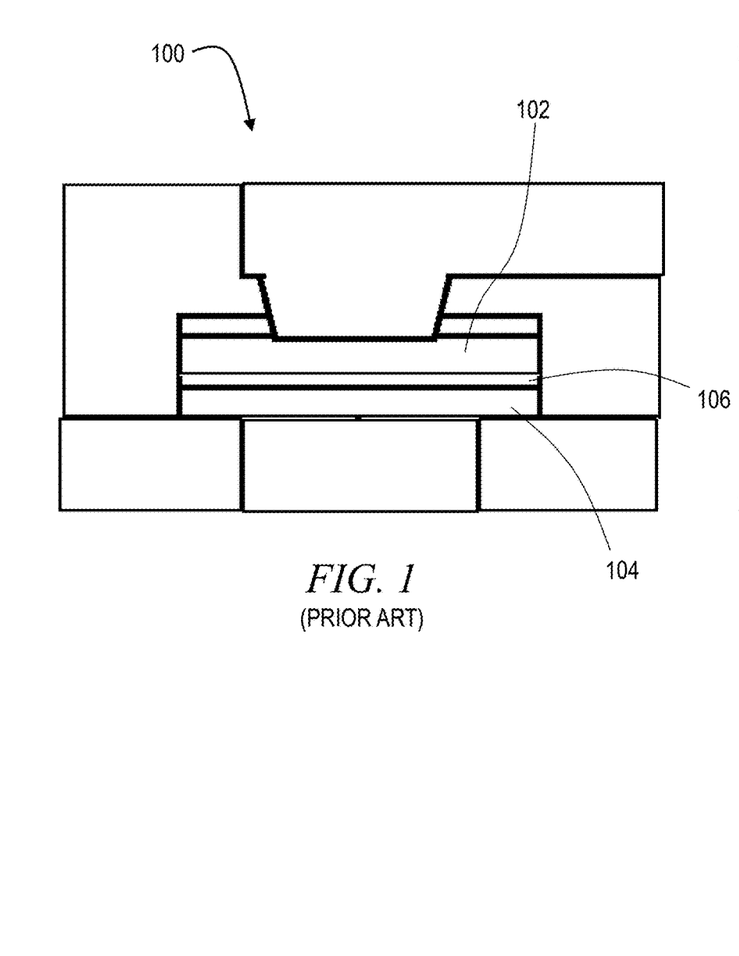
FIG. 1 depicts a prior art RRAM module.

For the sake of comparison, FIG. 1 depicts a prior-art RRAM module 100 that does not have a parallel resistance. The RRAM module 100 includes top metal 102, bottom metal 104, and an oxide layer 106 (classically, an $HfO_x$ (hafnium oxide) layer, but other materials could be used such as, by way of non-limiting examples, WOx, TaOx, TiOx, NiOx, SiOx, GeS, GeSe). The oxide layer 106 acts as an intentionally flawed dielectric, in which filaments of Hf (not shown in FIG. 1) can be adjusted to conduct through the layer by applying a sufficient electric field. Thus, when the filaments are properly formed, the oxide layer 106 is a "switchable" dielectric that transitions back and forth between a low-resistance state and a high-resistance state. If the filaments are underformed, however, the RRAM module 100 becomes a simple capacitor.

Figure 2:
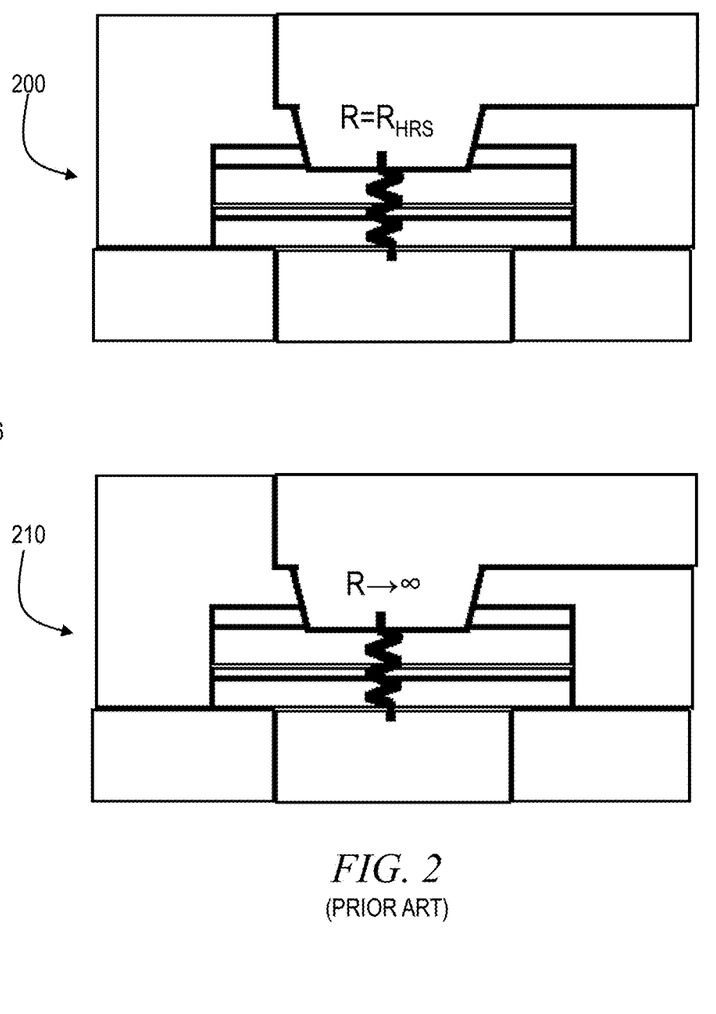
FIG. 2 depicts upper-bound resistances of properly formed and underformed prior-art RRAM modules without parallel resistance.

FIG. 2 illustrates the upper-bound resistances R of the module 100 for the two different scenarios of properly formed filaments (view 200) and underformed filaments (view 210). In scenario 200, $R=R_{HRS}$ (design value) in the high-resistance state. In scenario 210, $R\rightarrow\infty$ at all times.

Figure 3:
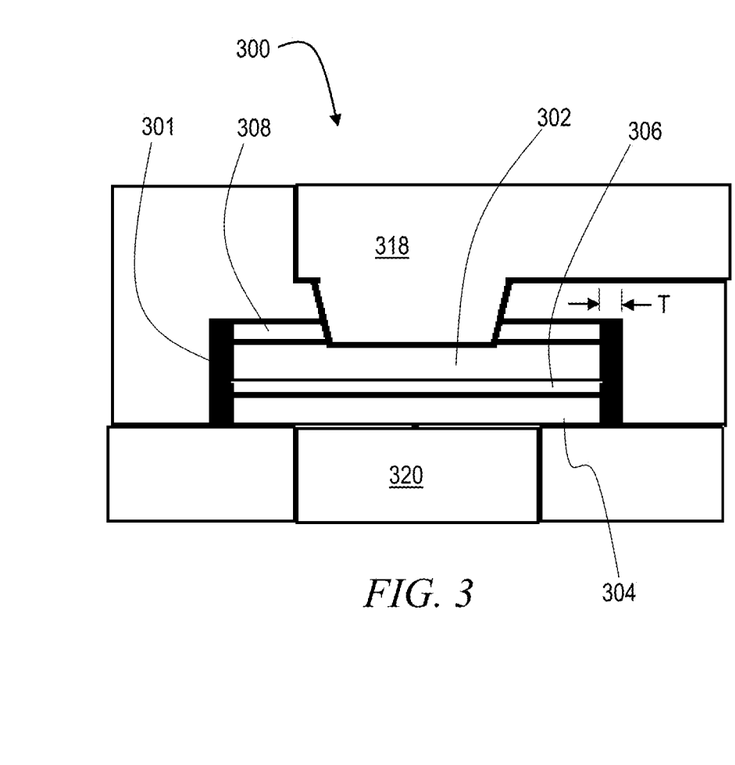
FIG. 3 depicts an RRAM module with parallel resistance, according to an exemplary embodiment.

FIG. 3, on the other hand, depicts an RRAM module 300 with parallel resistance 301, according to an exemplary embodiment. The parallel resistance (high-resistance semiconductive spacer) 301 is formed of a high-resistance semiconductive material, e.g., $Ti_xN_y$, $Ta_xN_y$, $TaO_xN_y$. In one or more embodiments, by way of non-limiting example, "semiconductive" signifies a resistivity ranging from about 100 μΩ/cm to about 5000 μΩ/cm. In one or more embodiments, the parallel resistance has a resistivity ranging from about 500 μΩ/cm to about 2000 μΩ/cm. In addition to top metal 302, bottom metal 304, and oxide layer (switchable dielectric) 306 (similarly formed as the switchable dielectric 106), the parallel resistance 301 provides an additional pathway for electricity to flow through the module from top metal 302 to bottom metal 304. Thus, even if the filaments of the module 300 are underformed, there is a path for current through the module from top contact 318 to bottom contact 320. Note that in a typical capacitive device it would be undesirable to build in an electrical shunt, such as the parallel resistance 301, that could bypass the dielectric. Note also that the filaments are of a microscopic nature and not amenable to illustration, but familiar to the skilled artisan.

Figure 4:
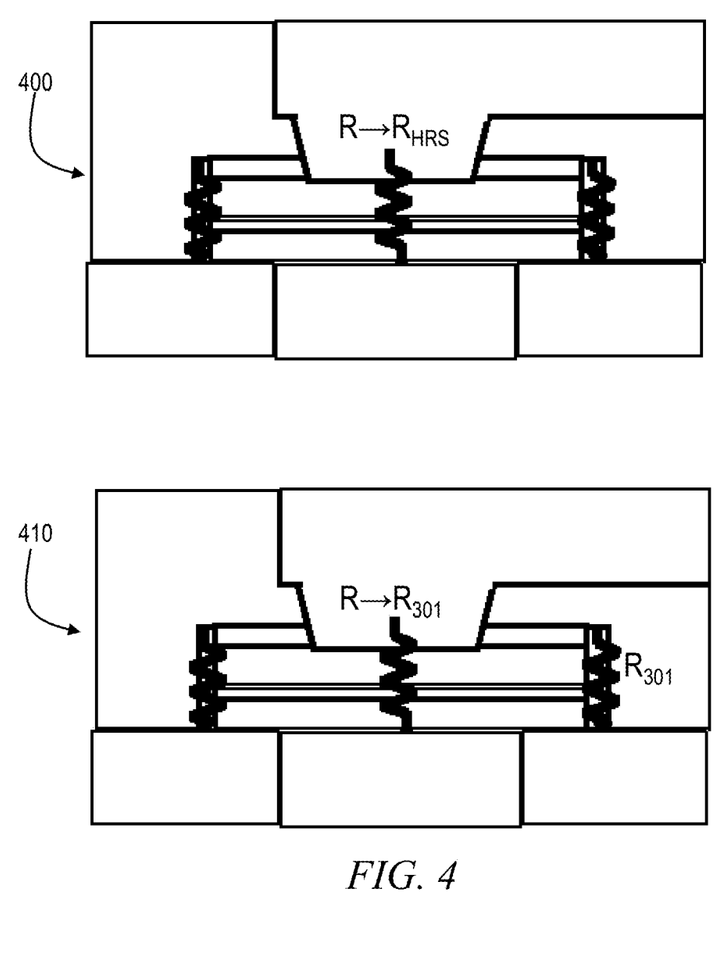
FIG. 4 depicts upper-bound resistances of properly formed and underformed RRAM modules with parallel resistance, according to an exemplary embodiment.

FIG. 4 illustrates the upper-bound resistances R of the module 300 for the two different scenarios of properly formed filaments (view 400) and underformed filaments (view 410). In scenario 400, $R=R_{RHS}\|R_{301}$, where $R_{301}$ is chosen much larger than $R_{RHS}$ so that $R\rightarrow R_{RHS}$ in the high-resistance state. In scenario 410, $R=\infty\|R_{301}$, so that $R\rightarrow R_{301}$ at all times. As will be appreciated by the skilled artisan, a parallel resistive circuit as one where the resistors are connected to the same two points (or nodes) and is identified by the fact that it has more than one current path connected to a common voltage source. In the case of n parallel resistors $R_1, R_2, \ldots, R_n$, the total parallel resistance $R_T$ is given by $R_T=(1/R_1+1/R_2++1/R_n)^{-1}$. In the first case with $R_{301}\gg R_{RHS}$, $1/R_{301}$ becomes negligible with respect to $1/R_{RHS}$. In the latter case with $R\rightarrow\infty$, $1/R$ approaches zero and becomes negligible with respect to $1/R_{301}$.

Forming the parallel resistance 301 involves adding steps to a process 500 for fabricating RRAM, as shown in FIGS. 5A through 5H.

Figure 5A:
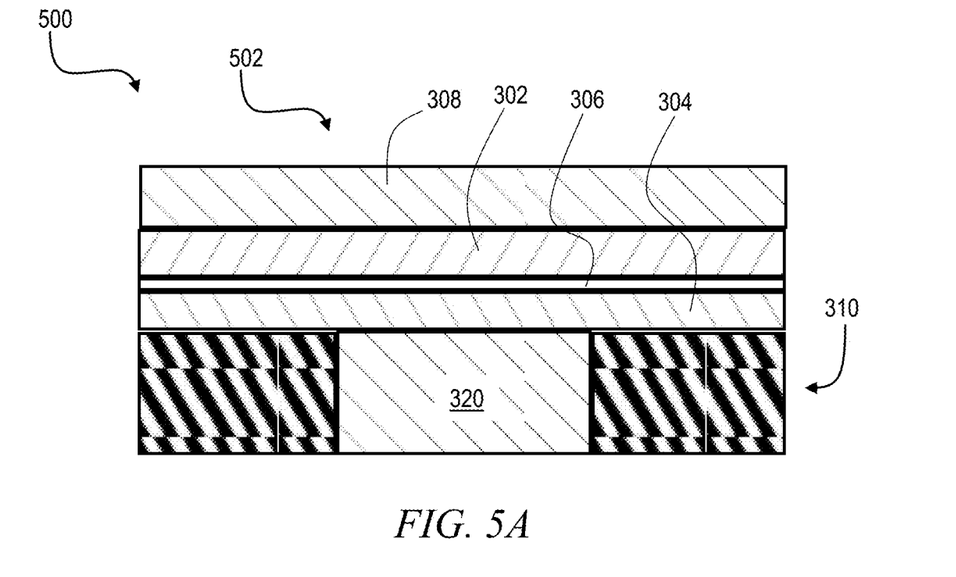
FIG. 5A through FIG. 5H depict steps of a process for forming the RRAM module with parallel resistance, according to an exemplary embodiment.

FIG. 5A shows step 502 (actually several steps combined for simplicity of illustration): deposit the RRAM stack of top metal 302, oxide 306, bottom metal 304, and hardmask 308 on a base structure 310 (note also bottom contact 320). It should be noted that, given the teachings herein, conventional semiconductor manufacturing techniques can be employed to fabricate one or more embodiments.

Figure 5B:
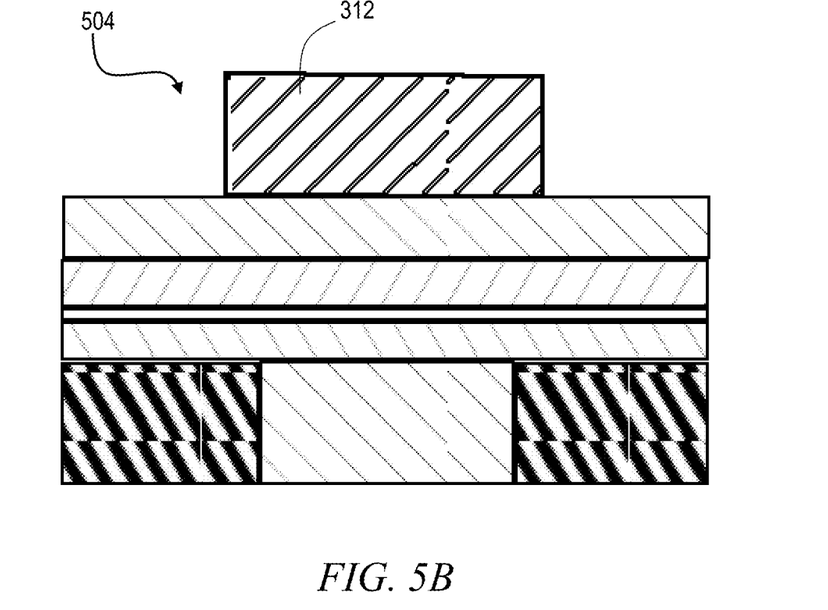

FIG. 5B shows step 504, lithography of the RRAM pillar with photoresist 312.

Figure 5C:
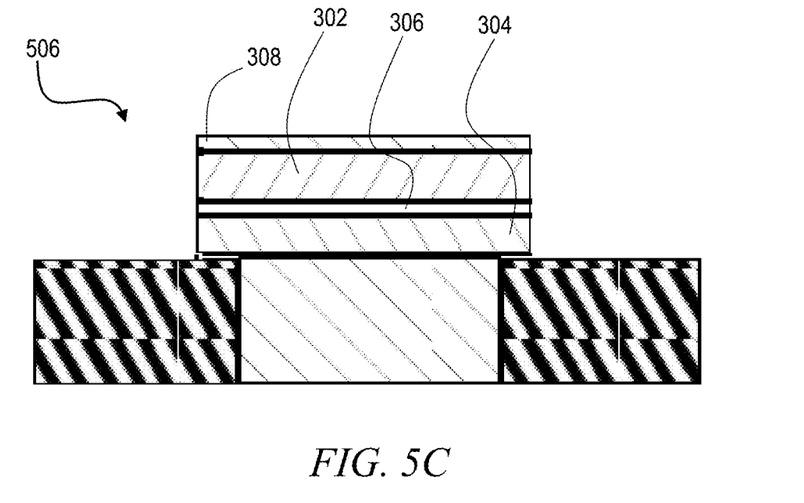

FIG. 5C shows step 506, RRAM pillar reactive ion etching (RIE).

Figure 5D:
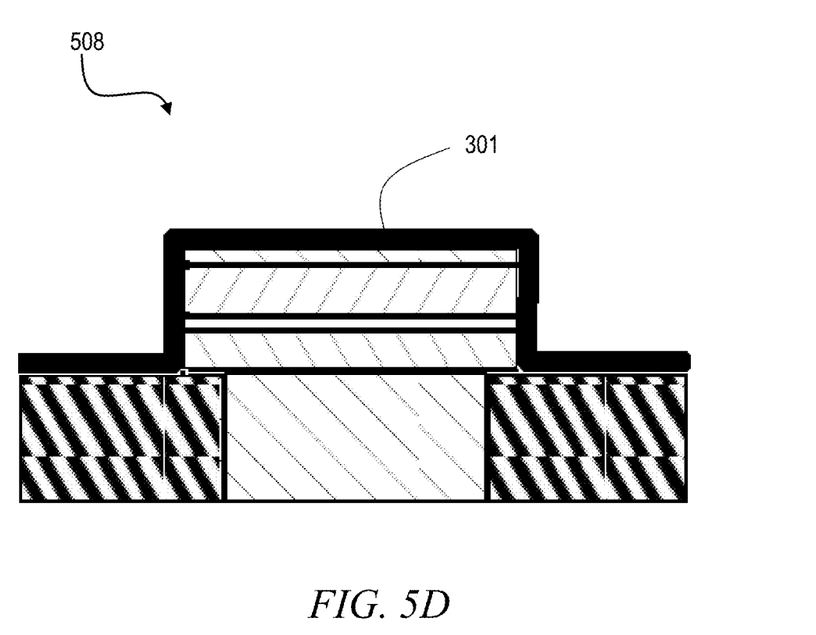

FIG. 5D shows step 508, deposition of high resistance material 301. The high resistance material incorporates a metallic substance in combination with a non-metal, producing a low conductivity that is still a higher conductivity than would typically be used in a spacer alongside a capacitor. Generally, the composition of high-resistance material 301 can be metal which is adjusted by alloy components of $A_xB_Y$ where A is metallic element such as (but not limited to) Ta or Ti and B is an alloy material such as (but not limited to) N or O which makes the material semi-conductive. Different deposition processes may be used, e.g., plasma atomic layer deposition (p-ALD) or thermal ALD (t-ALD). Selection of a suitable deposition process will affect the resistivity and other properties of the high resistance material 301.

Figure 5E:
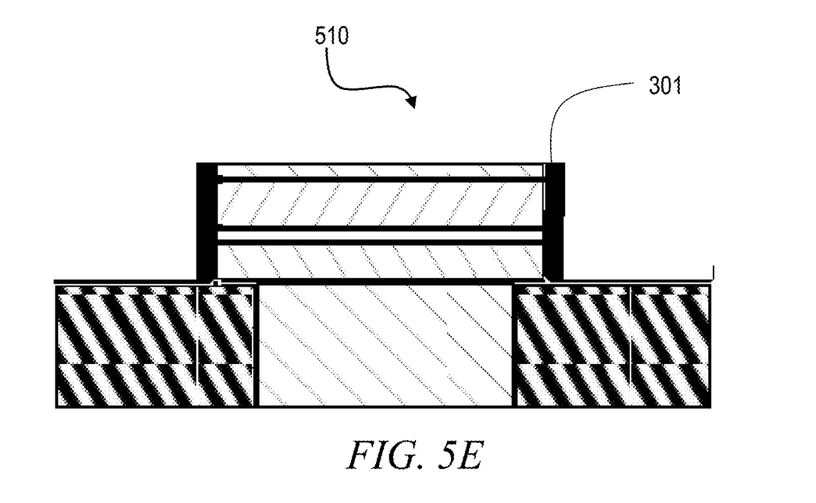

FIG. 5E shows step 510, spacer metal etching of the high resistance material 301.

Figure 5F:
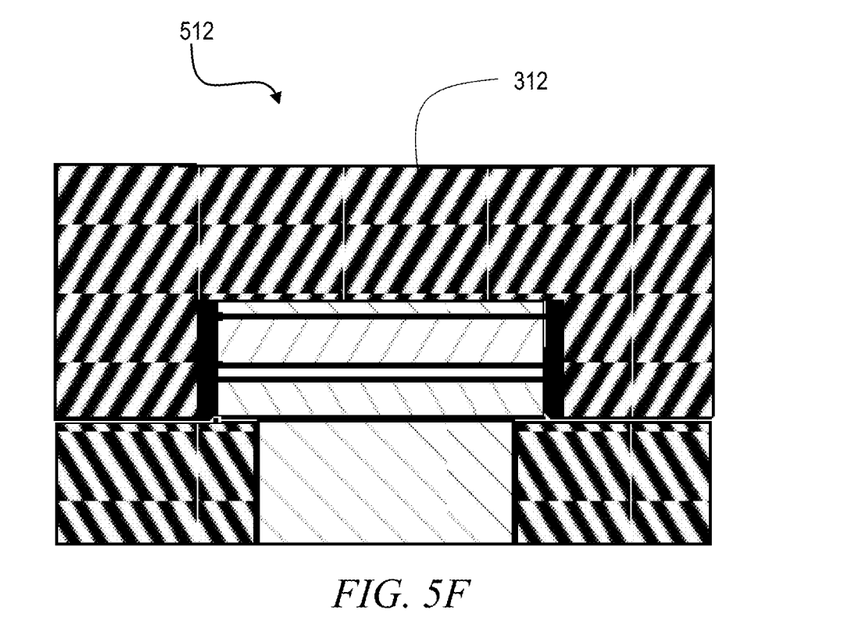

FIG. 5F shows step 512, deposition of interlayer dielectric 312 followed by chemical mechanical polishing.

Figure 5G:
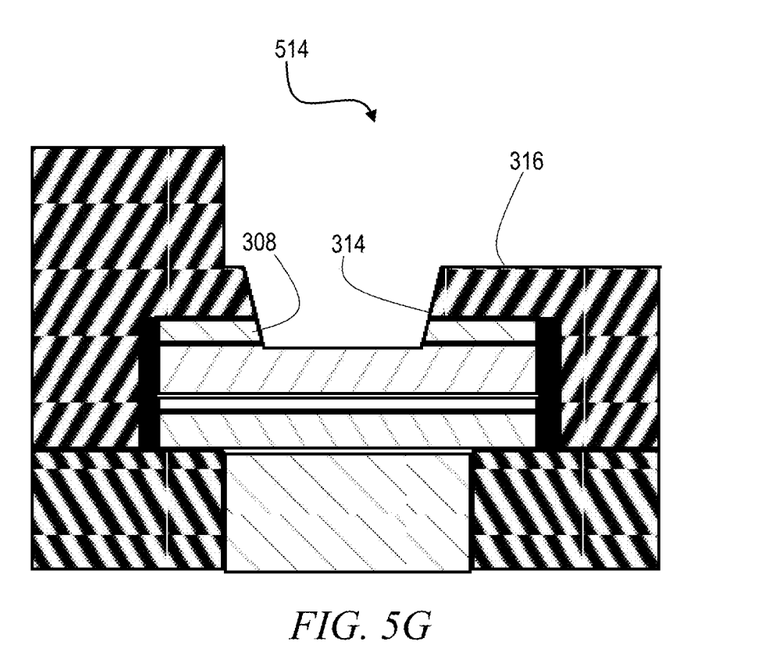

FIG. 5G shows step 514, etching a top contact via 314 through the hardmask 308 and etching a trench pattern 316 in the interlayer dielectric 312 (seen in FIG. 5F).

Figure 5H:
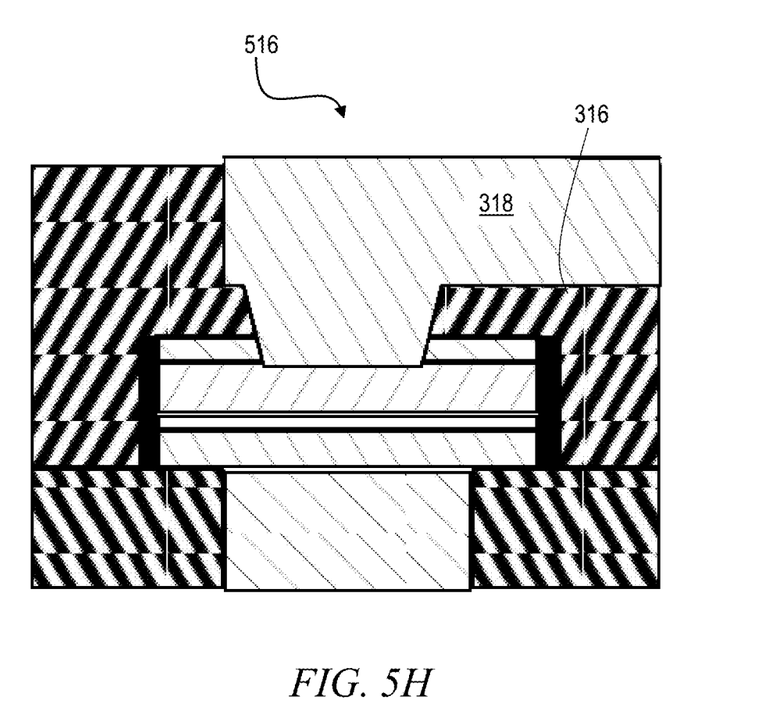

FIG. 5H shows step 516, top contact metallization by filling the trench 316 with metal to form the top contact 318.

Figure 6:
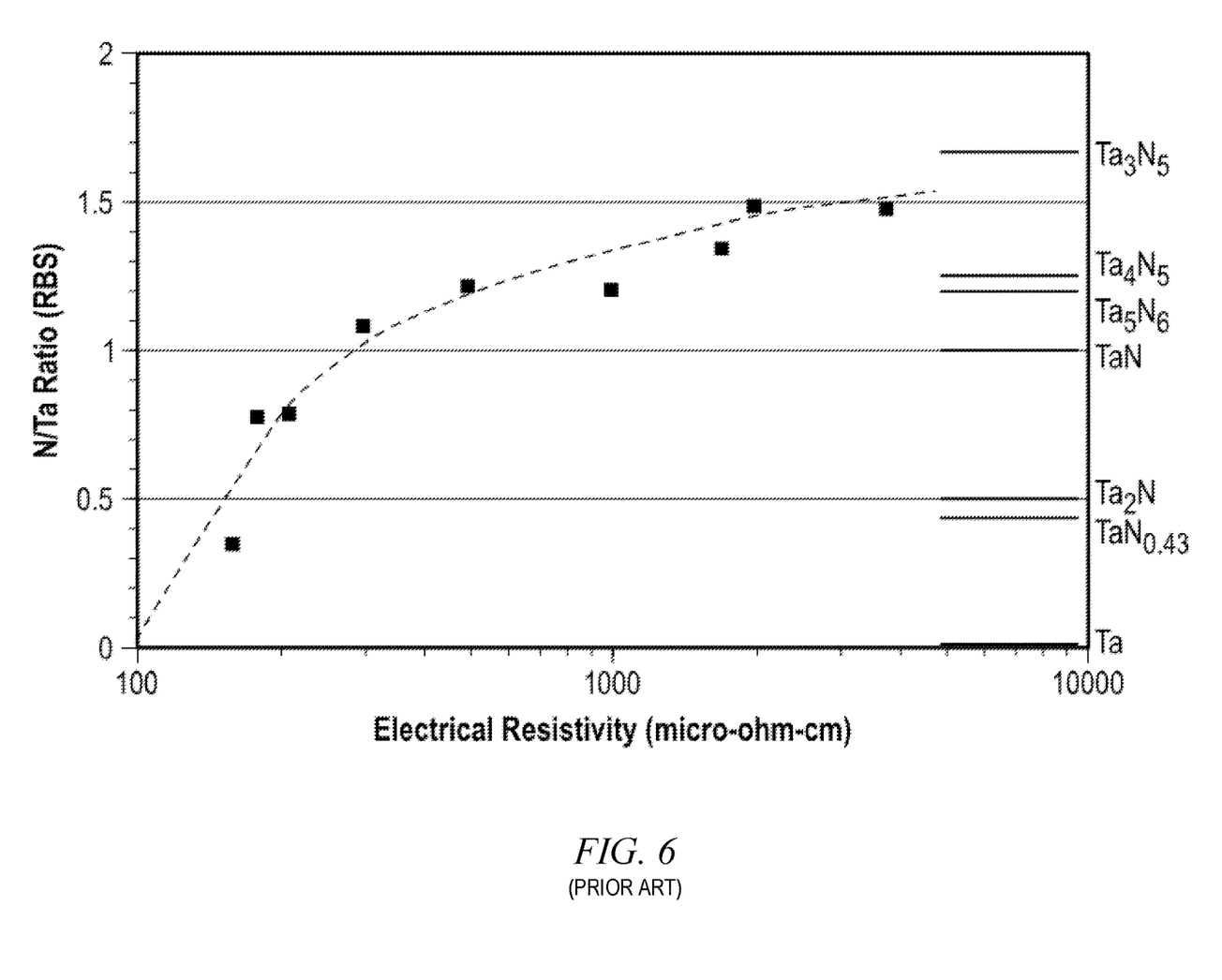
FIG. 6 depicts resistivity variations of TaN film according to nitrogen-to-tantalum ratio, as is known from the prior art.

In one or more embodiments, TaN or TiN films are used for the high resistance semiconductive material 301. Resistivity of such films is a function of nitrogen flow during deposition. Resistivity can vary from 100 μΩ-cm to 5000 μΩ-cm, as shown for example in FIG. 6 for TaN films, which shows N/Ta ratio determined by Rutherford backscattering spectrometry (RBS) plotted against electrical resistivity in me-cm (log scale), as is known from the prior art.

Figure 7:
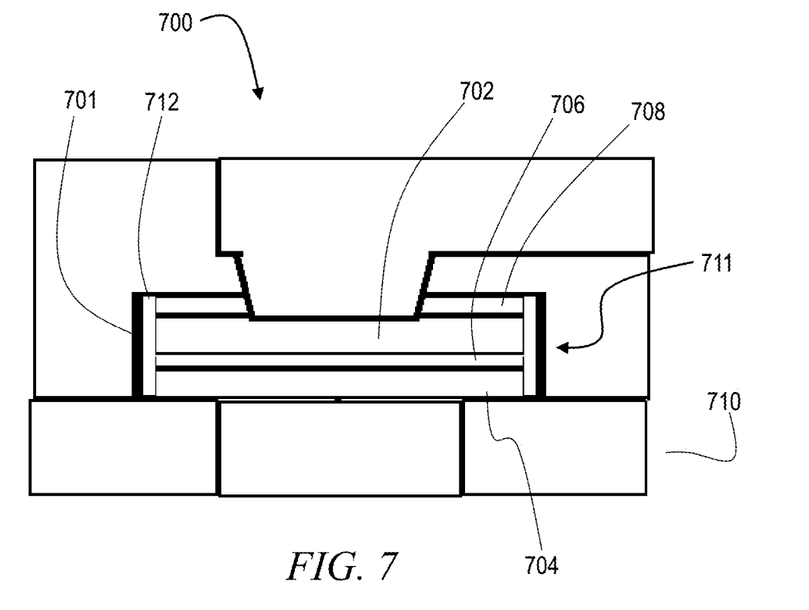
FIG. 7 depicts another RRAM module with parallel resistance and a passivating liner, according to another exemplary embodiment.

In one or more embodiments, as shown in FIG. 7, $Ta_xO_yN_z$ films are used for a high resistance parallel resistance (spacer) 701 in a modified RRAM 700. The modified RRAM includes a stack 711 of top metal 702, oxide 706, bottom metal 704, and hardmask 708 on a base structure 710. The modified RRAM also includes a passivation liner 712 between the high resistance material 701 and the stack 711. The passivation liner 712 blocks diffusion of oxygen from the TaON film into the oxide 706; such diffusion could have adverse effects on the filaments of the RRAM. In one or more embodiments, the passivation liner 712 is $Si_xN_y$, or other non-conductive material. The passivation liner 712 is thin, on the order of 1 nm-2 nm thickness, so that it blocks oxygen atoms from diffusing into the switchable dielectric 706 but permits electron tunneling from the top metal 702 to the parallel resistance 701 and from the parallel resistance 701 to the bottom metal 704.

In one or more embodiments, the high-resistance material 301 or 701 has a resistance much higher than the resistance of the switchable dielectric 306 or 706 in its high-resistance state. For example, in one or more embodiments the parallel resistance 301 has a resistance at least ten times the design value of resistance of the switchable dielectric 306 in its high-resistance state. In one or more embodiments, the resistance of the parallel resistance 301 is no greater than twenty times the design value of resistance of the switchable dielectric 306 in its high-resistance state. Thickness T of the parallel resistance 301 is chosen to provide a desirable cross-section according to the resistivity of the parallel resistance 301 and the design resistance of the switchable dielectric 306 in its high-resistance state. For example, in one or more embodiments the switchable dielectric is 2 nm-10 nm thick. Accordingly, in one or more embodiments, the parallel resistance 301 or 701 is 1 nm-50 nm thick. For example, the parallel resistance 301 or 701 is 1 nm-25 nm thick; in one or more embodiments, 5 nm-15 nm thick. Thus, in one or more embodiments, the high-resistance semiconductive spacer (parallel resistance 301 or 701) has a cross-sectional area no more than twenty-five times the thickness of the switchable dielectric. In one or more embodiments, the high-resistance semiconductive spacer has a cross-sectional area no less than one-half the thickness the switchable dielectric.

Material composition of the parallel resistance 301 or 701 is chosen for compatibility with the switchable dielectric, for example, oxides are not used in the parallel resistance 301. If an oxide is used, as in the parallel resistance 701, a passivation liner 712 such as $Si_xN_y$ is provided between the parallel resistance 701 and the switchable dielectric 706. In one or more embodiments, the passivation liner 712 is very thin, i.e., 1 nm-5 nm thickness, so that it blocks oxygen while being thin enough for tunneling effects to bypass its resistance. In one or more embodiments, the passivation liner 712 is of 1 nm-2 nm thickness.

Figure 8:
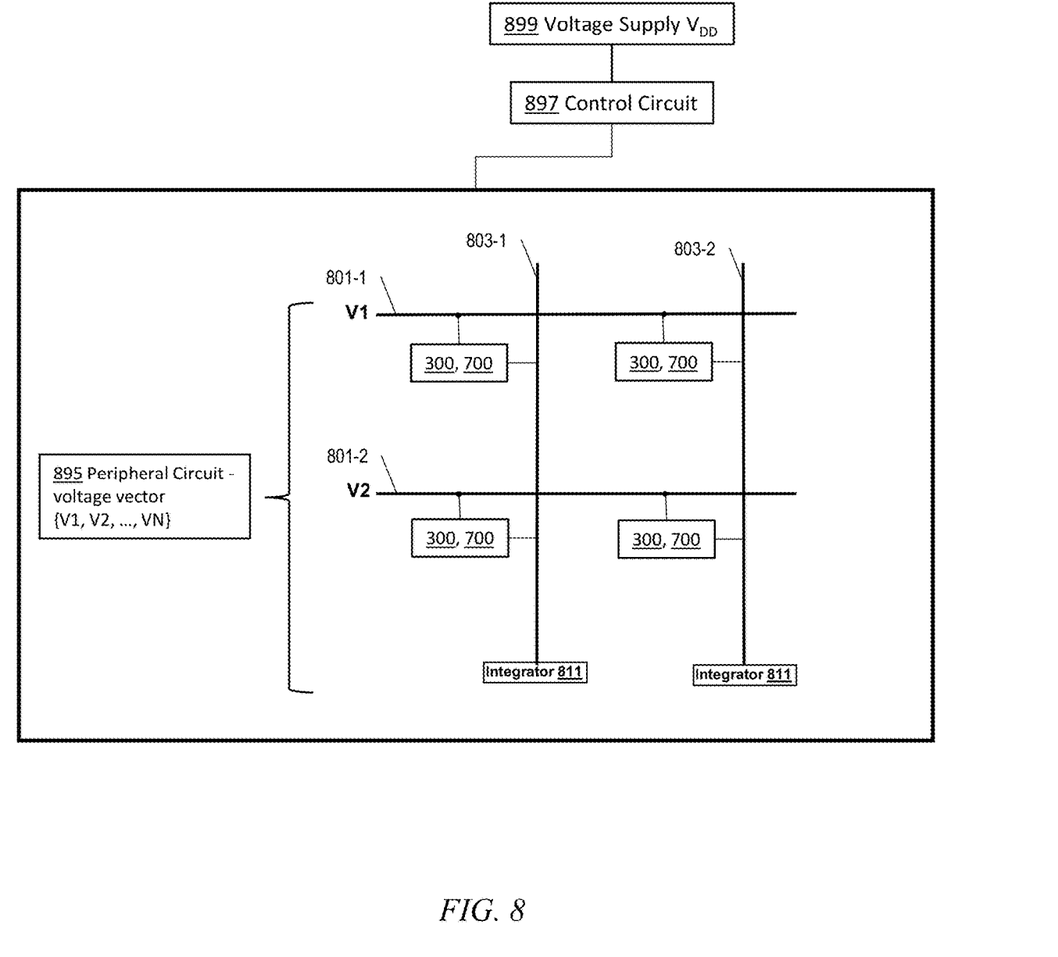
FIGS. 8 and 9 depict a neural network array that incorporates RRAM according to an exemplary embodiment.
Figure 9:
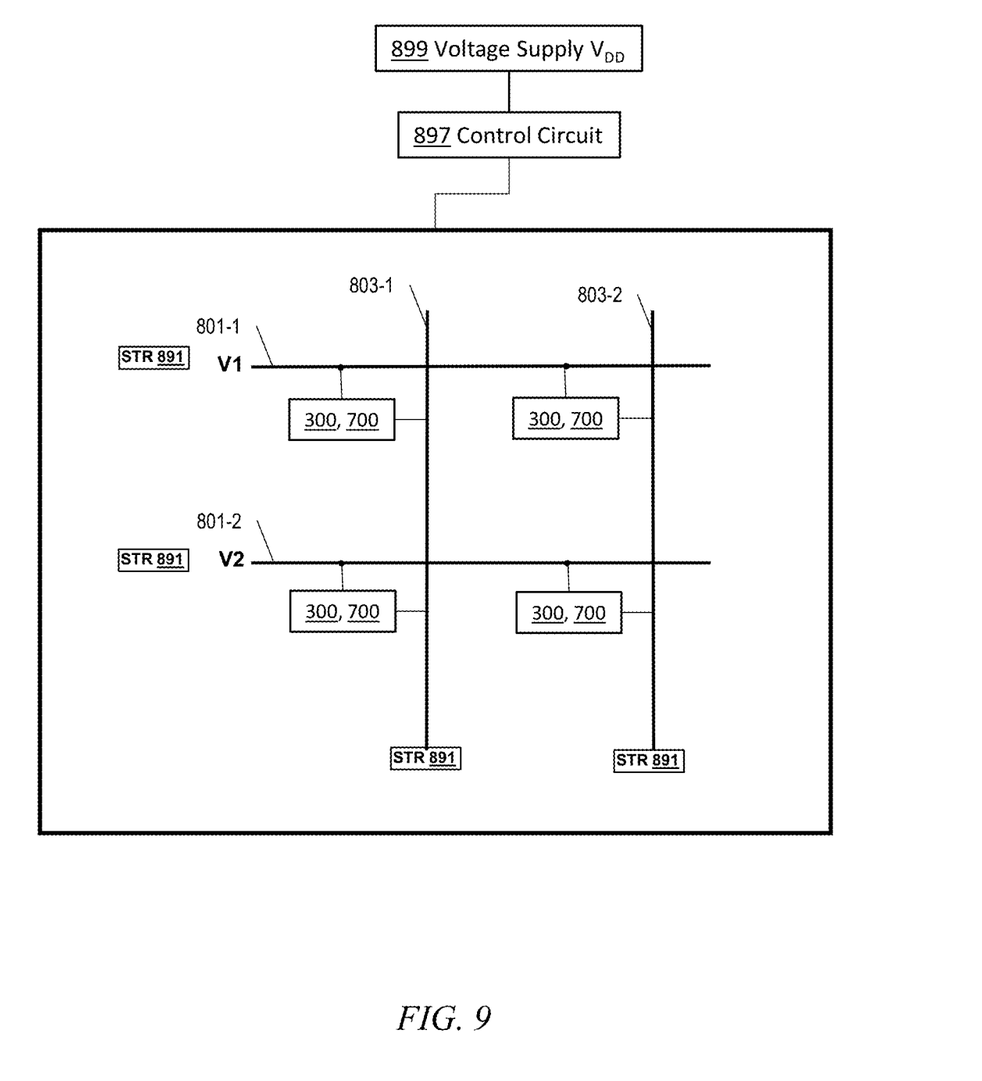

In one or more embodiments, as depicted in FIGS. 8 and 9, the cell 300 or 700 is incorporated into a neural network array. The neural network array includes word lines 801-1 and 801-2 and bit lines 803-1 and 803-2 (only two of each are shown for simplicity). At each grid point (intersection of word line and bit line), a cell is located.

Typically, neural networks are trained by a backpropagation algorithm in which training data is fed into the network at a front end and propagates "forward" through the network to a back end. The output of the network at the back end then is compared to an expected result, which is provided a priori by expert knowledge. An error differential between the output and the expected result is calculated and used to derive an error gradient. The error gradient then is propagated "backward" through the network (from back end toward front end) in order to update the weights assigned to each neuron's inputs. This process of forward and backward propagation is repeated to progressively reduce the error differential by iteratively updating the weights, until a desired value of error differential or a desired error rate (e.g., less than 3%) is achieved. Training of large neural networks, typically, is a time consuming and computationally intensive task that demands data-center-scale computational resources recruited for many days. The concept of resistive cross-point devices (RRAM) can potentially accelerate neural network training by orders of magnitude while using less computational power.

Training RRAM is different from training a typical neural network processing unit. In an embodiment, an RRAM module is trained using a backpropagation method that includes three cycles, namely a forward cycle, a backward cycle, and a weight update cycle (herein "weight update" in short). The forward and backward cycles mainly involve computing vector-matrix multiplication in the forward and backward directions. The weight associated with an RRAM module can be updated by a simple AND operation between two voltages, one (e.g., on a word line) representing the activity at the input to the RRAM module and the other (e.g., on a bit line) representing the error computed by the output neuron. When positive or negative bits coincide, the conductivity of the RRAM module is augmented or diminished accordingly, thereby adjusting the corresponding weight. Bit stream length determines the precision of the weight update to arbitrary exactitude. A stream with more bits brings the weight closer to its "true" value for correcting the error differential.

FIG. 8 shows a backward cycle wherein peripheral circuit 895 applies a voltage vector to the word lines 801-1 and 801-2 and integrators 811 integrate the column current. A forward cycle is the same except that the voltage vector is applied to the columns and integrators integrate the rows. FIG. 9 shows stochastic update wherein stochastic translators (STR) 891 apply the stochastic pulses to the word lines and bit lines. Voltage supply 899 and control circuit 897 provide operating voltage and control the application of voltage vectors, stochastic pulses, and the integration. The skilled artisan will be familiar with operation and control of arrays of RPUs from, for example, Gokmen T. and Vlasov Y., Acceleration of Deep Neural Network Training with Resistive Cross-Point Devices: Design Considerations, Front. Neurosci. 10:333, doi: 10.3389/fnins.2016.00333, 21 Jul. 2016 and Gokmen T., Onen M. and Haensch W., Training Deep Convolutional Neural Networks with Resistive Cross-Point Devices, Front. Neurosci. 11:538. doi: 10.3389/fnins.2017.00538, 10 Oct. 2017.

Figure 10:
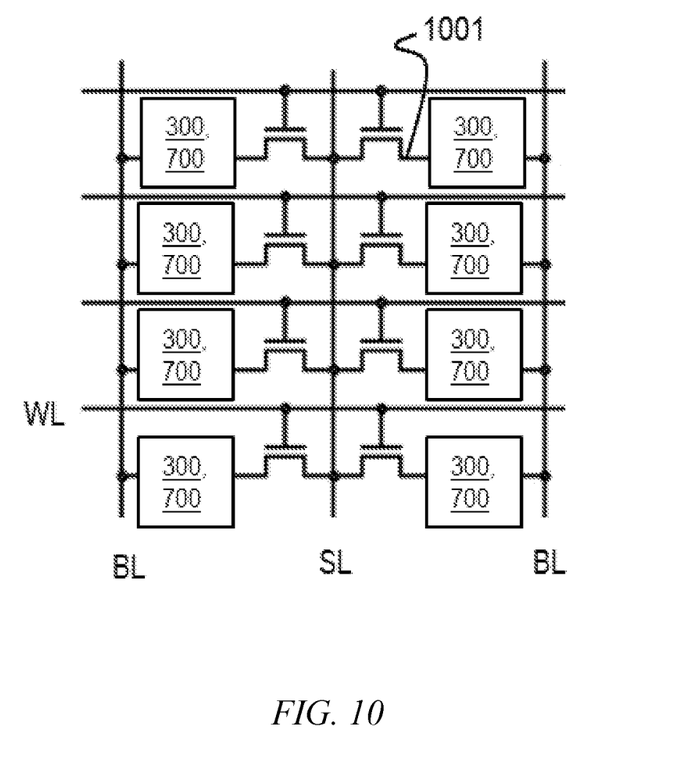
FIG. 10 depicts optional use of an exemplary embodiments in series with a field effect transistor.

Referring to FIG. 10, as noted above, in some instances a one-transistor-one-resistor ("1T1R") setup can be used to mitigate potential shorts. In the 1T1R setup, a transistor 1001 in series with the RRAM module 300, 700 must switch on before current can flow. The transistor is switched off by the same signal that should set the RRAM module to its HRS, so even if the RRAM module is shorted, the switched-off transistor simulates the expected HRS. In other words, the 1T1R approach provides a lower bound to the RRAM resistance in the high-resistance state. Modules 300, 700 in accordance with aspects of the invention can be used in this approach, thus advantageously setting both lower and upper bounds. Note word lines WL (connected to the gates of the transistors), bitlines BL, and source lines SL that connect to the sources of the transistors 1001 in a known manner.

It will be appreciated that, in general, the top contact 318 and bottom contact 320 are each coupled to a corresponding word line or bit line at the grid point, directly or through one or more intervening elements such as transistors 1001.

One or more embodiments are suitable, for example, for carrying out multiply accumulate (MAC) operations for machine learning. For example, turn on all the word lines 801-1, 801-2 and inject all the information and read out all the results at once (i.e., not just one word line at a time like in a conventional memory, but employing massively parallel in-memory computation).

Given the discussion thus far, it will be appreciated that, in general terms, an exemplary electronic circuit, according to an aspect of the invention, includes a plurality of word lines 801-1, 801-2; a plurality of bit lines 803-1, 803-2 intersecting the plurality of word lines at a plurality of grid points; and a plurality of resistive random-access memory cells 300, 700 located at the plurality of grid points. Each of the resistive random-access memory cells includes a top metal 302 coupled to one of: a corresponding one of the word lines and a corresponding one of the bit lines; a bottom metal 304 coupled to another one of: the corresponding one of the word lines and the corresponding one of the bit lines; a dielectric 306 sandwiched between the top metal and the bottom metal; and a high-resistance semiconductive spacer 301 that electrically connects the top metal and the bottom metal in parallel with the dielectric. References to elements in FIG. 3 are applicable, as will be appreciated, to analogous elements in FIG. 7 as well.

In one or more embodiments, the dielectric 306 is a switchable dielectric that is adapted to take on a high-resistance state in response to a first applied electric field and take on a low-resistance state in response to a second applied electric field, and the high-resistance semiconductive spacer 301 has a resistance at least ten times a design value of the resistance of the switchable dielectric in its high-resistance state. The design value will be the value that the designer intended and can be definitely ascertained, for example, by the value exhibited for most cells in a matrix, on the reasonable assumption that only a few cells will have manufacturing defects.

In one or more embodiments, the high-resistance semiconductive spacer has a resistance no more than twenty times a design value of the resistance of the switchable dielectric in its high-resistance state. In one or more embodiments, the high-resistance semiconductive spacer has a cross-sectional area no more than two hundred times the cross section of a design filament of the switchable dielectric. In one or more embodiments, the high-resistance semiconductive spacer has a cross-sectional area no less than fifty times the cross section of a design filament of the switchable dielectric. Here again the design value or design filament will be the value that the designer intended and can be definitely ascertained, for example, by the value exhibited for most cells in a matrix, on the reasonable assumption that only a few cells will have manufacturing defects.

In one or more embodiments, the cell 700 also includes a passivation liner 712 between a high-resistance semiconductive spacer 701 and a switchable dielectric 706. The passivation liner is sufficiently thick to block diffusion of oxygen and sufficiently thin to permit electron tunneling. In one or more embodiments, the high-resistance semiconductive spacer 701 includes a metal oxide and the passivation liner 712 includes one of a nitride and a carbide. In one or more embodiments, the high-resistance semiconductive spacer includes a tantalum oxide and the passivation liner includes a silicon nitride.

In one or more embodiments, the switchable dielectric 306 or 706 includes a hafnium oxide and the high-resistance semiconductive spacer 301 or 701 includes one of a titanium nitride and a tantalum nitride. In one or more embodiments, the high-resistance semiconductive spacer includes $Ta_4N_5$.

According to another aspect, an exemplary method 500 is provided for making a resistive random-access memory. At 502, form a bottom metal 304 onto a base structure 310 that includes a bottom contact 320, wherein the bottom metal contacts the bottom contact; form a dielectric 306 on top of and contacting the bottom metal; form a top metal 302 on top of and contacting the dielectric; and form a hardmask 308 on top of and contacting the top metal. At 510, form a high-resistance semiconductive spacer 301 electrically contacting the top metal and the bottom metal. At 512, deposit an interlayer dielectric 316 over the hardmask and the high-resistance spacers. At 514, form a via and trench in the interlayer dielectric. At 516, form a top contact that contacts the top metal, by filling the via and trench with metal 318.

In one or more embodiments, the method also includes forming the dielectric as a switchable dielectric that is adapted to take on a high-resistance state in response to a first applied electric field and take on a low-resistance state in response to a second applied electric field. In one or more embodiments, the method also includes forming the high-resistance semiconductive spacer to have a resistance at least ten times a design value of the resistance of the switchable dielectric in its high-resistance state. In one or more embodiments, the method also includes forming the high-resistance semiconductive spacer to have a resistance no more than twenty times a design value of the resistance of the switchable dielectric in its high-resistance state. In one or more embodiments, the switchable dielectric includes a hafnium oxide. In one or more embodiments, the high-resistance semiconductive spacer includes one of a titanium nitride and a tantalum nitride. In one or more embodiments, the high-resistance semiconductive spacer includes a metal oxide, and the method further includes forming a passivation liner 712 between the switchable dielectric and the high-resistance semiconductive spacer, wherein the passivation liner includes a nitride.

In one or more embodiments, the method also includes forming the high-resistance semiconductive spacer to have a cross-sectional area no more than two hundred times the cross section of a design filament of the switchable dielectric. In one or more embodiments, the method also includes forming the high-resistance semiconductive spacer to have a cross-sectional area no less than fifty times the cross section of a design filament of the switchable dielectric.

According to another aspect, resistive random-access memory cell for interconnection with a word line 801-1, 801-2 and a bit line 803-1, 803-2 comprises a top metal 302; a bottom metal 304; a switchable dielectric 306 that is sandwiched between the top metal and the bottom metal and electrically connects the top metal to the bottom metal; and a high-resistance semiconductive spacer 301 that electrically connects the top metal and the bottom metal. The switchable dielectric is adapted to take on a high-resistance state in response to a first applied electric field and take on a low-resistance state in response to a second applied electric field. The high-resistance semiconductive spacer has a resistance at least ten times but no more than twenty times a design value of resistance of the switchable dielectric in its high-resistance state. The top metal is coupled to one of: the word line and the bit line, and the bottom metal is coupled to another one of: the word line and the bit line.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1$^{st}$ *Edition*, Prentice Hall, 2001, as well as more recent technical papers and/or textbooks, as would be apparent to the skilled artisan. It is emphasized that while some individual processing steps are set forth herein, those steps are merely illustrative, and one skilled in the art may be familiar with several equally suitable alternatives that would be applicable.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An electronic circuit, comprising:
   a plurality of word lines;
   a plurality of bit lines intersecting the plurality of word lines at a plurality of grid points; and
   a plurality of resistive random-access memory cells located at the plurality of grid points, each of the resistive random-access memory cells comprising:
   a top metal coupled to one of: a corresponding one of the word lines and a corresponding one of the bit lines;
   a bottom metal coupled to another one of: the corresponding one of the word lines and the corresponding one of the bit lines;
   a dielectric sandwiched between the top metal and the bottom metal, wherein the dielectric comprises a switchable dielectric that is adapted to take on a high-resistance state in response to a first applied electric field and take on a low-resistance state in response to a second applied electric field;
   a high-resistance semiconductive spacer electrically connecting the top metal and the bottom metal in parallel with the dielectric, wherein the high-resistance semiconductive spacer has a resistance at least equal to a design value of the resistance of the switchable dielectric in its high-resistance state; and
   a passivation liner between the high-resistance semiconductive spacer and the switchable dielectric, wherein the passivation liner is sufficiently thick to block diffusion of oxygen and sufficiently thin to permit electron tunneling.

2. The electronic circuit of claim 1, wherein the high-resistance semiconductive spacer has a resistance not more than one hundred times the design value of the resistance of the switchable dielectric in its high-resistance state.

3. The electronic circuit of claim 2, wherein the high-resistance semiconductive spacer has a resistance not more than twenty times the design value of the resistance of the switchable dielectric.

4. The electronic circuit of claim 3, wherein the high-resistance semiconductive spacer has a resistance not less than ten times the design value of the resistance of the switchable dielectric.

5. The electronic circuit of claim 1, wherein the high-resistance semiconductive spacer comprises a metal oxide and the passivation liner comprises one of a nitride and a carbide.

6. The electronic circuit of claim 5, wherein the high-resistance semiconductive spacer comprises a tantalum oxide and the passivation liner comprises a silicon nitride.

7. The electronic circuit of claim 1, wherein the switchable dielectric comprises a hafnium oxide and the high-resistance semiconductive spacer comprises one of a titanium nitride and a tantalum nitride.

8. The electronic circuit of claim 7, wherein the high-resistance semiconductive spacer comprises $Ta_4N_5$.

9. A method for making a resistive random-access memory, the method comprising:
   forming a bottom metal onto a base structure that includes a bottom contact, wherein the bottom metal contacts the bottom contact;
   forming, on top of and contacting the bottom metal, a switchable dielectric that is adapted to take on a high-resistance state in response to a first applied electric field and take on a low-resistance state in response to a second applied electric field;
   forming a top metal on top of and contacting the dielectric;
   forming a hardmask on top of and contacting the top metal;
   forming a high-resistance semiconductive spacer electrically contacting the top metal and the bottom metal;
   forming a passivation liner between the switchable dielectric and the high-resistance semiconductive spacer, wherein the passivation liner comprises a nitride;
   depositing an interlayer dielectric over the hardmask and the high-resistance spacers;
   forming a via and trench in the interlayer dielectric; and
   forming a top contact that contacts the top metal, by filling the via and trench with metal.

10. The method of claim 9, further comprising forming the high-resistance semiconductive spacer to have a resistance not more than one hundred times a design value of a resistance of the switchable dielectric.

11. The method of claim 10, further comprising forming the high-resistance semiconductive spacer to have a resistance not less than the design value of the resistance of the switchable dielectric.

12. The method of claim 11, further comprising forming the high-resistance semiconductive spacer to have a resistance at least ten times a design value of the resistance of the switchable dielectric in its high-resistance state.

13. The method of claim 12, further comprising forming the high-resistance semiconductive spacer to have a resistance not more than twenty times a design value of the resistance of the switchable dielectric in its high-resistance state.

14. The method of claim 9, wherein the switchable dielectric comprises a hafnium oxide.

15. The method of claim 14, wherein the high-resistance semiconductive spacer comprises one of a titanium nitride and a tantalum nitride.

16. A resistive random-access memory cell for interconnection with a word line and a bit line, comprising:
   a top metal configured for connection with one of the word line and the bit line;
   a bottom metal configured for connection with another one of the word line and the bit line;
   a switchable dielectric that is sandwiched between the top metal and the bottom metal and electrically connects the top metal to the bottom metal, wherein the switchable dielectric is adapted to take on a high-resistance state in response to a first applied electric field and take on a low-resistance state in response to a second applied electric field;
   a high-resistance semiconductive spacer electrically connecting the top metal and the bottom metal in parallel with the dielectric, wherein the high-resistance semiconductive spacer has a resistance at least ten times but no more than twenty times a design value of resistance of the switchable dielectric in its high-resistance state; and a passivation liner between the switchable dielectric and the high-resistance semiconductive spacer, wherein the passivation liner comprises a nitride.

\* \* \* \* \*